(12) United States Patent
Won et al.

(10) Patent No.: US 9,013,945 B2
(45) Date of Patent: Apr. 21, 2015

(54) TOKEN RING ARCHITECTURE BASED MEMORY SYSTEM AND OPERATING METHOD TO OPTIMIZE CURRENT CONSUMPTION

(71) Applicant: SK Hynix Inc., Icheon-si Gyeonggi-do (KR)

(72) Inventors: Sam Kyu Won, Icheon-si Gyeonggi-do (KR); Sung Hyun Jung, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 184 days.

(21) Appl. No.: 13/711,279

(22) Filed: Dec. 11, 2012

(65) Prior Publication Data

US 2014/0010033 A1    Jan. 9, 2014

(30) Foreign Application Priority Data

Jul. 4, 2012 (KR) ........................ 10-2012-0072738

(51) Int. Cl.
*G11C 5/14* (2006.01)
*G06F 15/16* (2006.01)
*G06F 13/40* (2006.01)
*G11C 7/22* (2006.01)

(52) U.S. Cl.
CPC ... *G11C 5/14* (2013.01); *G11C 7/22* (2013.01)

(58) Field of Classification Search
CPC ..... G06F 1/266; G06F 1/3203; H04J 14/0221
USPC ............ 365/227; 710/307; 709/251; 713/300
See application file for complete search history.

(56) References Cited

U.S. PATENT DOCUMENTS

| 2006/0031593 | A1* | 2/2006 | Sinclair | ......................... 709/251 |
| 2009/0198857 | A1* | 8/2009 | Pyeon | ......................... 710/307 |
| 2010/0174927 | A1* | 7/2010 | Kim et al. | ..................... 713/300 |

FOREIGN PATENT DOCUMENTS

| KR | 1020020051396 A | 6/2002 |
| KR | 1020100087809 A | 8/2010 |

* cited by examiner

*Primary Examiner* — J. H. Hur
*Assistant Examiner* — Ajay Ojha
(74) *Attorney, Agent, or Firm* — William Park & Associates Patent Ltd.

(57) ABSTRACT

A memory system includes first to third memory devices each having an input terminal for receiving a token signal and an output terminal for transmitting the token signal, wherein the input terminal of each of the first to third memory devices are connected to the output terminal of another memory device through a ring topology, a subset of the first to third memory devices substantially simultaneously perform an operation of consuming a peak current in response to any one of a plurality of token signals, and each of the first to third memory devices possesses only any one of the plurality of token signals and transmits the other token signals to another memory device.

28 Claims, 10 Drawing Sheets

TOKEN RING ARCHITECTURE BASED MEMORY SYSTEM AND OPERATING METHOD TO OPTIMIZE CURRENT CONSUMPTION

CROSS-REFERENCES TO RELATED APPLICATION

The present application claims priority under 35 U.S.C. §119(a) to Korean application number 10-2012-0072738, filed on Jul. 4, 2012, in the Korean Intellectual Property Office, which is incorporated herein by reference in its entirety.

BACKGROUND

1. Technical Field

The present invention generally relates to a memory system, and more particularly, to a memory system of which the peak current consumption is optimized and an operating method of a memory device included therein.

2. Related Art

As large-capacity files such as music files or moving image files are used in mobile electronic devices, a memory system has been required to have a large storage capacity. The memory system includes a plurality of memory devices to increase a storage capacity. The memory system including a plurality of memory devices requires a high operation speed as well as a large storage capacity as one of important characteristics thereof.

The memory system may perform a parallel operation such as an interleaving operation, in order to quickly operate. In this case, since the plurality of memory devices consume power at the same time, system down or current spike caused by the consumption of peak current may occur in the memory system.

The memory system is designed to maintain a sufficient power resource for processing such peak power events, that is, operations in which the memory devices consume the peak power at the same time. However, the peak power events relatively rarely occur, and the average power consumption of the memory devices may be substantially smaller than the peak power consumption. However, the memory system is designed to store a sufficient power level, even through the peak power is not needed at all times.

SUMMARY

A memory system of which the peak current consumption is optimized and an operating method of a memory device included therein are described herein.

In an embodiment, a memory system includes first to third memory devices each having an input terminal for receiving a token signal and an output terminal for transmitting the token signal, wherein the input terminal of each of the first to third memory devices are connected to the output terminal of another memory device through a ring topology, a subset of the first to third memory devices substantially simultaneously perform an operation of consuming a peak current in response to any one of a plurality of token signals, and each of the first to third memory devices possesses only any one of the plurality of token signals and transmits the other token signals to another memory device.

In another embodiment, an operating method of a memory device includes the steps of: receiving a token signal from another memory device; calculating the magnitude of an available current based on the received token signal; comparing the magnitude of the available current to the magnitude of a peak current of the memory device; and performing an operation of consuming the peak current when the magnitude of the available current is larger than or equal to the magnitude of the peak current.

In another embodiment, a memory system includes first and second memory devices each having an input terminal for receiving a token signal and an output terminal for transmitting the token signal, wherein the output terminal of the first memory device is connected to the input terminal of the second memory device, the output terminal of the second memory device is connected to the input terminal of the input terminal of the first memory device, and the first and second memory devices perform an operation of consuming a peak current based on the magnitude information of an available current, contained in a received token signal.

BRIEF DESCRIPTION OF THE DRAWINGS

Features, aspects, and embodiments are described in conjunction with the attached drawings, in which.

DETAILED DESCRIPTION

Hereinafter, a memory system and an operating method of a memory device included therein according to the various embodiments will be described below with reference to the accompanying drawings through the embodiments.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the various embodiments, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
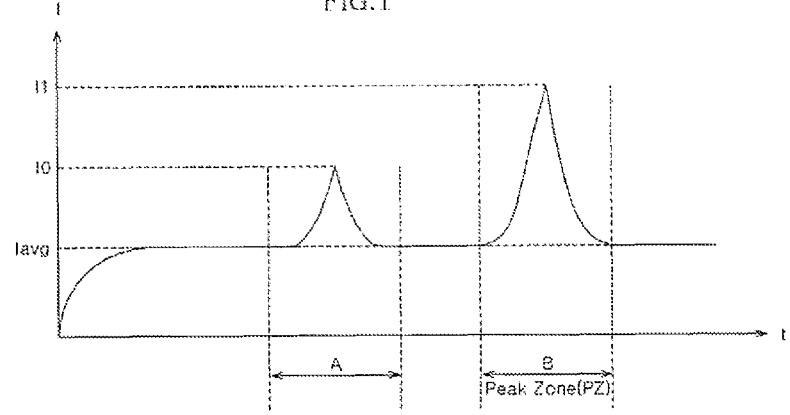
FIG. 1 is a diagram for explaining the concept of a peak zone according to various embodiments.

FIG. 1 is a diagram for explaining the concept of a peak zone according to an embodiment. The x-axis represents time t and the y-axis represents current I.

During a read operation, write (or program) operation, or erase operation of a semiconductor device, a period in which the semiconductor device consumes a larger current I0 or I1 than an average consumption current Iavg occurs (for example, period A or B). Such a period A or B may rarely or frequently occur during the operation of the memory device. When an event in which the largest current I1 is consumed during the period A or B simultaneously occurs in a plurality of memory devices, the event may have a fatal effect on a power resource of a memory system.

Hereafter, between the period A and B in which a larger amount of current is consumed than the average consumption current Iavg, the period in which the largest current I1 is consumed is defined as a peak current consumption period, that is, a peak zone PZ. Furthermore, an operation of the memory device, included in the peak zone PZ, is defined as a peak zone operation (PZO). The peak zone operation (PZO) may occur for a moment during an enabled operation of the memory device, that is, a read operation, write operation, or erase operation.

Figure 2:
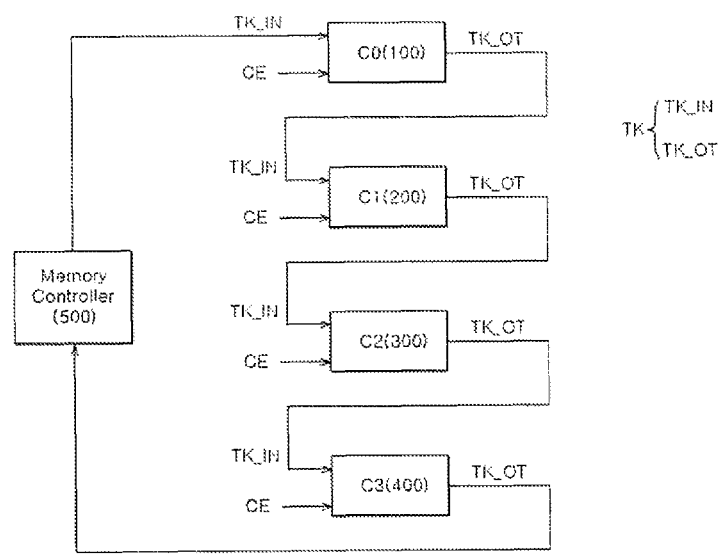
FIG. 2 is a block diagram illustrating a memory system according to an embodiment.
Figure 3:
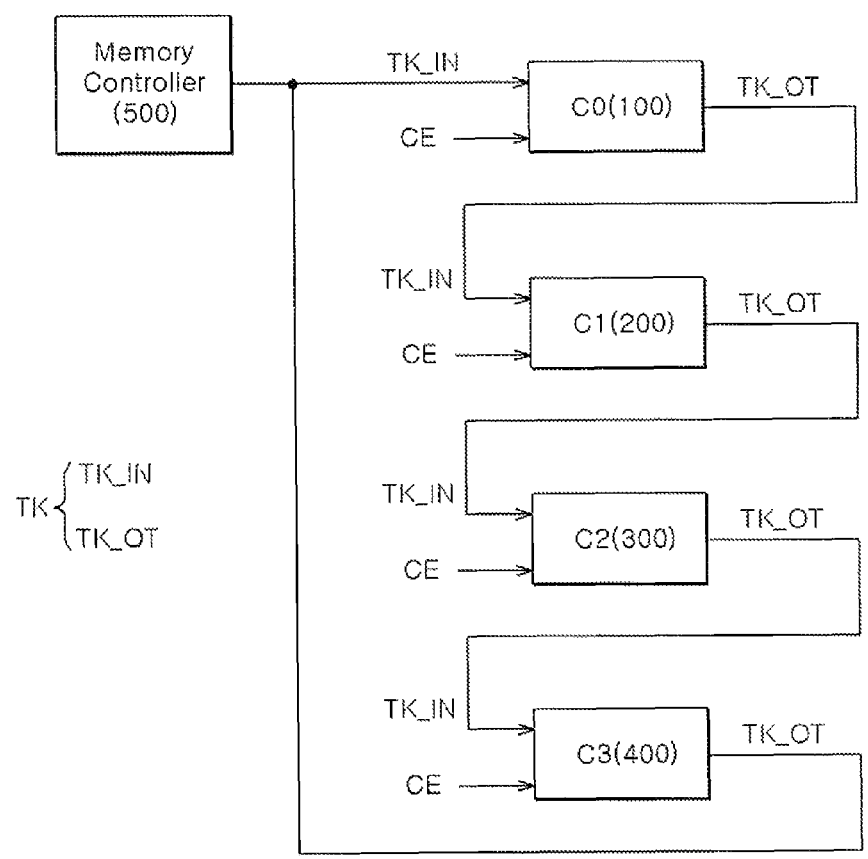
FIG. 3 is a block diagram illustrating a memory system according to an embodiment.

FIG. 2 is a block diagram illustrating a memory system according to an embodiment. FIG. 3 is a block diagram illustrating a memory system according to an embodiment. Referring to FIGS. 2 and 3, the memory system 1000 or 2000 may include a plurality of memory devices 100 to 400 (i.e., C0(100), C1(200), C2(300), and C3(400)) and a memory controller 500. For convenience of description, FIGS. 2 and 3 illustrate the memory system including four memory devices 100 to 400, but the number of memory devices included in the memory system 1000 or 2000 may be changed when necessary.

The memory controller 500 may be configured to control overall operations of the memory system 1000 or 2000. For example, the memory controller 500 may be configured to control the memory devices 100 to 400 in response to a request provided from a host (not illustrated). For this operation, the memory controller 500 may provide a control signal, an address, data and the like to the respective memory devices 100 to 400.

Each of the memory devices 100 to 400 may operate according to the control of the memory controller 500. Additionally, the memory devices 100 to 400 are enabled by a chip enable signal CE provided from the memory controller 500. Furthermore, the operations of the memory devices 100 to 400 may be controlled by a token signal TK provided from the memory controller 500. Each of the memory devices 100 to 400 may receive the token signal TK as a token signal TK_IN and transmit the token signal TK as a token signal TK_OUT.

The token signal TK may indicate a right of the memory devices 100 to 400 to perform a peak zone operation (PZO). For example, a memory device receiving the token signal TK_IN may perform a peak zone operation (PZO). On the other hand, a memory device which did not receive the token signal TK_IN may perform a different operation (for example, an operation in which the memory device does not consume the peak current), but cannot perform a peak zone operation (PZO). The token signal TK is used to enable the memory devices 100 to 400 to perform a peak zone operation (PZO) at the same time within an allowable current of the memory system 1000 or 2000.

The memory devices 100 to 400 may be connected through a ring topology such that a memory device receives the token signal TK from another memory device and provides the used token signal TK to another memory device. The memory systems 1000 and 2000 illustrated in FIGS. 2 and 3 are different from each other depending on whether or not the memory controller 500 is included in the ring topology for transmitting the token signal TK.

Referring to FIG. 2, the memory controller 500 is included in the ring topology for transmitting the token signal TK. That is, a token output terminal of the memory controller 500 may be connected to a token input terminal of the first memory device 100, a token output terminal of the first memory device 100 may be connected to a token input terminal of the second memory device 200, a token output terminal of the second memory device 200 may be connected to a token input terminal of the third memory device 300, a token output terminal of the third memory device 300 may be connected to a token input terminal of the fourth memory device 400, and a token output terminal of the fourth memory device 400 may be connected to a token input terminal of the memory controller 500. In the memory system 1000, the memory controller 500 may directly control the token signal TK transmitted between the respective memory devices 100 to 400.

Referring to FIG. 3, the memory controller 500 is not included in the ring topology for transmitting the token signal TK. That is, a token output terminal of the memory controller 500 may be connected to a token input terminal of the first memory device 100, a token output terminal of the first memory device 100 may be connected to a token input terminal of the second memory device 200, a token output terminal of the second memory device 200 may be connected to a token input terminal of the third memory device 300, a token output terminal of the third memory device 300 may be connected to a token input terminal of the fourth memory device 400, and a token output terminal of the fourth memory device 400 may be connected to a token input terminal of the first memory device 100. In the memory system 2000, the memory controller 500 is configured to transmit only the first token signal TK to the first memory device 100. The transmitted token signal TK is transmitted between the respective memory devices 100 to 400.

Figure 4:
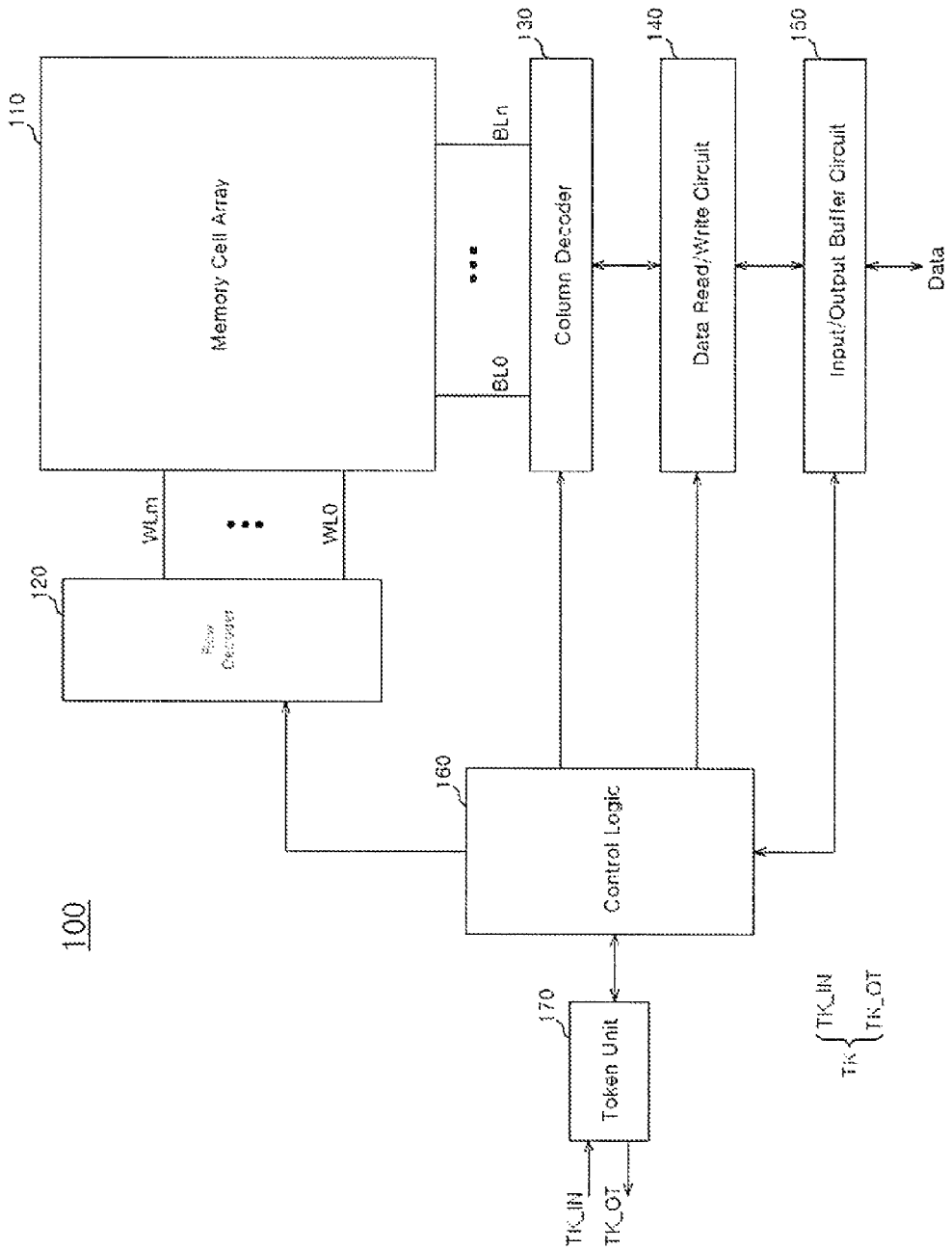
FIG. 4 is a block diagram illustrating a memory device according to an embodiment.

FIG. 4 is a block diagram illustrating the memory device according to an embodiment. The memory devices 100 to 400 included in the memory systems 1000 and 2000 of FIGS. 2 and 3 have the same configuration. Therefore, FIG. 4 illustrates only the memory device 100, for convenience of description.

Referring to FIG. 4, the memory device 100 may include a memory cell array 110, a row decoder 120, a column decoder 130, a data read/write circuit 140, an input/output buffer circuit 150, a control logic 160, and a token unit 170.

The memory cell array 110 may include a plurality of memory cells arranged at the respective intersections between word lines WL0 to WLm and bit lines BL0 to BLn. The plurality of memory cells are configured to store data provided from an external device (not illustrated). The plurality of memory cells may include volatile memory cells or nonvolatile memory cells depending on the structure of cell transistors.

The row decoder 120 may be connected to the memory cell array 110 through the plurality of word lines WL0 to WLm. The row decoder 120 may be configured to decode an inputted address. The row decoder 120 may be configured to transmit various word line voltages to the word lines WL0 to WLm according to the decoding result. For example, the row decoder 120 may provide a select voltage to a selected word line, and provide an unselect voltage to an unselected word line.

The column decoder 130 may be connected to the memory cell array 110 through the plurality of bit lines BL0 to BLn. The column decoder 130 may be configured to decode an inputted address. The column decoder 130 may be configured to selectively connect the bit lines BL0 to BLn to the data read/write circuit 140 according to the decoding result.

The data read/write circuit 140 may operate according to the control of the control logic 160. The data read/write circuit 140 may operate as a write driver or sense amplifier depending on the operation mode. For example, the data read/write circuit 140 may be configured to program data (i.e., Data) inputted from an external device through the input/output buffer circuit 150 into memory cells of the memory cell array 110 during a program operation. As another example, the data read/write circuit 140 may be configured to read programmed data from memory cells of the memory cell array 110 during a read operation.

The input/output buffer circuit 150 may be configured to receive data from an external device (for example, a memory controller, a memory interface or the like) or output data to the external device. For this operation, the input/output buffer circuit 150 may include a data latch circuit and an output driving circuit.

The control logic 160 may be configured to control overall operations of the memory device 100 in response to a command provided from an external device (for example, a memory controller, a memory interface or the like). For example, the control logic 160 may control a read operation, a write (or program) operation, and an erase operation of the memory device 100.

Additionally, the control logic 160 may be configured to check whether the token unit 170 receives a token signal TK_IN or not, before performing a peak zone operation (PZO). The control logic 160 may wait for or perform a peak zone operation (PZO) according to a response signal provided from the token unit 170.

The token unit 170 may be configured to process the token signal TK transmitted inside the memory system 1000 or 2000 of FIG. 2 or 3. The token unit 170 may be configured to receive the token signal TK_IN and transmit the token signal TK_OT. Furthermore, the token unit 170 may be configured to decide whether or not to perform a peak zone operation (PZO) based on the received token signal TK_IN. That is, the token unit 170 may be configured to process a request of the control logic 160 to perform a peak zone operation (PZO) according to whether the token signal TK_IN is received or not. The token unit 170 will be described in detail with reference to FIGS. 6 and 9 according to an embodiment.

Figure 5:
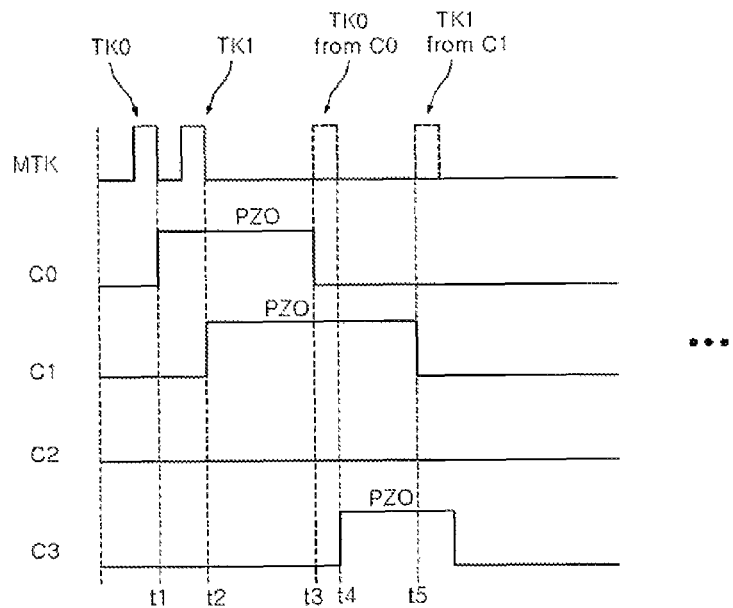
FIG. 5 is a timing diagram for explaining an operating method of the memory system according to an embodiment.

FIG. 5 is a timing diagram for explaining an operating method of the memory system according to an embodiment.

According to the embodiments associated with FIG. 5, the memory system 1000 or 2000 of FIG. 2 or 3 may be configured to use a plurality of token signals TK, that is, multi-token signals MTK. As described above, in the memory system 1000 or 2000 using a token signal TK, only a memory device receiving the token signal TK_IN may perform a peak zone operation (PZO). In the memory system 1000 or 2000 using multi-token signals MTK, memory devices corresponding to the number of multi-token signals MTK may perform a peak zone operation (PZO) at the same time or substantially the same time.

Additionally, the memory controller 500 of FIG. 2 or 3 may control the number of multi-token signals MTK within a limit current of the memory system 1000 or 2000. The limit current may be designed based on the peak current of the memory devices 100 to 400 included in the memory system 1000 or 2000. This means that the number of multi-token signals MTK may be controlled based on the peak current of the memory devices 100 to 400 included in the memory system 1000 or 2000. Furthermore, the limit current may be designed based on the number of the memory devices 100 to 400 included in the memory system 1000 or 2000. This means that the number of multi-token signals MTK may be controlled based on the number of the memory devices included in the memory system 1000 or 2000.

For convenience of description, FIG. 5 illustrates that the memory system 1000 or 2000 uses two token signals TK0 and TK1. In FIG. 5, suppose that memory devices C0, C1, and C3 should perform a peak zone operation (PZO), but are waiting for a peak zone operation (PZO) because a token signal TK0 or TK1 is not received. Furthermore, suppose that a memory device C2 has no request for a peak zone operation (PZO).

According to the connection relation among the memory devices C0 to C3 (that is, the token terminal connection relation illustrated in FIG. 2 or 3), the first token signal TK0 is transmitted to the memory device C0 at a time point t1. The memory device C0 performs a peak zone operation (PZO) based on the first token signal TK0.

According to the connection relation among the memory devices C0 to C3, the second token signal TK1 is transmitted to the memory device C0. Since the memory device C0 is performing a peak zone operation (PZO) based on the first token signal TK0, the memory device C0 transmits the received second token signal TK1 to the memory device C1. The second token signal TK1 is transmitted to the memory device C1 at a time point t2. The memory device C1 performs a peak zone operation (PZO) based on the second token signal TK1.

Since the number of token signals used in the memory system 1000 or 2000 is limited to two, the memory device C3 waiting for a peak zone operation (PZO) cannot perform the peak zone operation (PZO) until the token signal TK0 or TK1 is received.

The memory device C0 transmits the first token signal TK0 to the memory device C1 at a time point t3, when the peak zone operation (PZO) is completed. Since the memory device C1 is performing the peak zone operation (PZO) based on the second token signal TK1, the memory device C1 transmits the received first token signal TK0 to the memory device C2. As supposed above, the memory device C2 has no request for a peak zone operation (PZO). Therefore, the memory device C2 transmits the received first token signal TK0 to the memory device C3.

The first token signal TK0 is transmitted to the memory device C3 at a time point t4. The memory device C3 performs a peak zone operation (PZO) based on the first token signal TK0. Furthermore, the memory device C1 transmits the second token signal TK1 to the memory device C2 at a time point t5, when the peak zone operation (PZO) is completed.

In this way, the memory devices C0 to C3 of the memory system 1000 or 2000 may perform a peak zone operations (PZOs) at the same time. Therefore, the power consumption of the memory system 1000 or 2000 may be stabilized. Furthermore, since the peak zone operations (PZOs) can be performed at the same time, the operation speed of the memory system 1000 or 2000 may also be improved.

Figure 6:
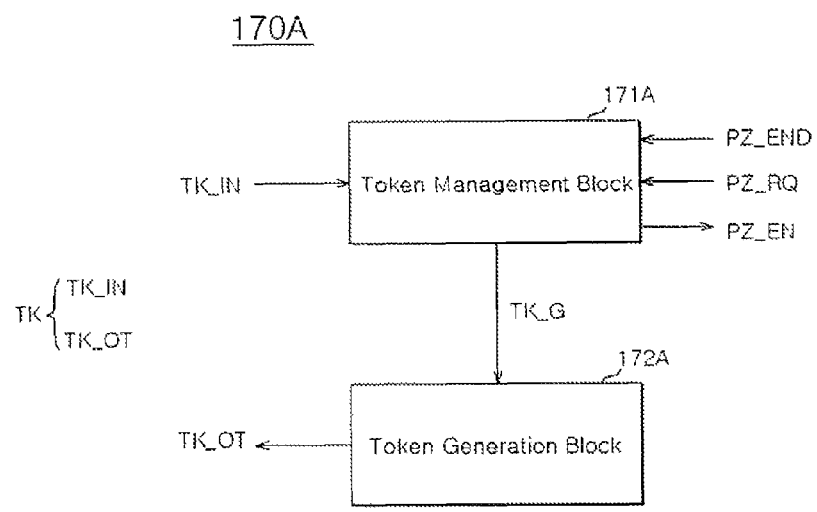
FIG. 6 is a block diagram illustrating a token unit of the memory device according to the embodiments associated with FIG. 5.

FIG. 6 is a block diagram illustrating the token unit of the memory device according to the embodiments associated with FIG. 5. FIG. 6 illustrates the token unit 170A configured to provide the multi-token signals MTK. The token unit 170A may include a token management block 171A and a token generation block 172A.

The token management block 171A may be configured to receive a token signal TK_IN from another memory device. The token management block 171A may be configured to operate according to a peak zone operation request signal PZ_RQ provided from, for example, the control logic 160 of FIG. 4. The token generation block 172A may be configured to generate the token signal TK_OT according to the control of the token management block 171A, and transmit the generated token signal TK_OT to another memory device.

For example, when the control logic 160 has no request for a peak zone operation (PZO), that is, when the peak zone operation request signal PZ_RQ is not activated, the token management block 171A may bypass the received token signal TK_IN. In this case, the token management block 171A provides a token generation signal TK_G to the token generation block 172A. The token generation block 172A generates a token signal TK_OT in response to the token generation signal TK_G, and transmits the generated token signal TK_OT to another memory device.

As another example, when the control logic 160 has a request for a peak zone operation (PZO), that is, when the peak zone operation request signal PZ_RQ is activated, the token management block 171A determines whether the token signal TK_IN is received or not. When the token signal TK_IN is received, the token management block 171A provides a peak zone operation enable signal PZ_EN to the control logic 160. The peak zone operation enable signal PZ_EN indicates that the peak zone operation (PZO) is possible. When the peak zone operation enable signal PZ_EN is activated, the control logic 160 performs a peak zone operation (PZO). On the other hand, when the token signal TK_IN is not received, the token management block 171A does not activate the peak zone operation enable signal PZ_EN. When the peak zone operation enable signal PZ_EN is not activated, the control logic 160 waits for a peak zone operation (PZO).

As another example, when a peak zone operation (PZO) is completed, that is, when a peak zone operation end signal PZ_END is activated, the token management block 171A may transmit the token signal TK_OT. In this case, the token management block 171A provides the token generation signal TK_G to the token generation block 172A. The token generation block 172A generates a token signal TK_OT in response to the token generation signal TK_G, and transmits the generated token signal TK_OT to another memory device.

Figure 7:
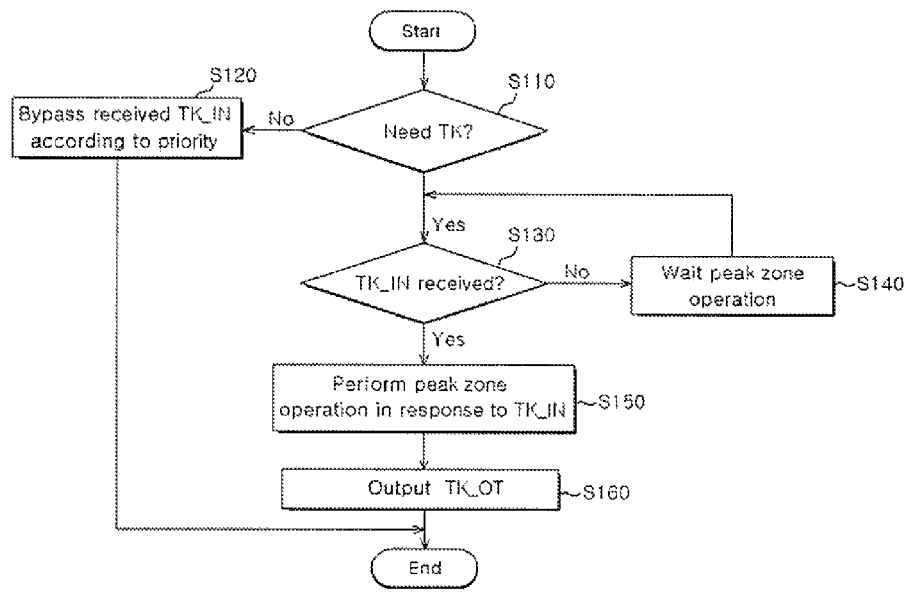
FIG. 7 is a flow chart for explaining the operation of a memory device following the operating method of the memory system according to the embodiments associated with FIG. 5.

FIG. 7 is a flow chart for explaining the operation of a memory device following the operating method of the memory system according to the embodiments associated with FIG. 5. Each of the memory devices 100 to 400 should operate according to certain rules, in order to use and transmit the multi-token signals MTK inside the memory system 1000 or 2000 of FIG. 2 or 3. The operation of the memory device will be described in detail with reference to FIGS. 6 and 7.

At step S110 (i.e., Need TK?), the token management block 171A may determine whether a token signal TK is needed or not. That is, the token management block 171A may determine whether the peak zone operation request signal PZ_RQ provided from the control logic 160 of FIG. 4 is activated or not.

At step S120 (i.e., Bypass received TK_IN according to priority), when the token signal TK is not needed (i.e., No), the token management block 171A may bypass the token signal TK_IN received through the token generation block 172A according to a priority. Here, the priority indicates an order at which the token signal is received.

At step S130 (i.e., TK_IN received?), when the token signal TK is needed (i.e., Yes), the token management block 171A may determine whether the token signal TK_IN was received or not. When the token signal TK_IN was not received (i.e., No), the procedure proceeds to step S140, and when the token signal TK_IN was received (i.e., Yes), the procedure proceeds to step S150.

At step S140 (i.e., Wait peak zone operation), the control logic 60 waits for a peak zone operation (PZO) according to the deactivated peak zone operation enable signal PZ_EN provided from the token management block 171A.

At step S150 (i.e., perform peak zone operation in response to TK_IN), the control logic 160 may perform the peak zone operation (PZO) according to the activated peak zone operation enable signal PZ_EN provided from the token management block 171A. Additionally, while the peak zone operation (PZO) is performed according to the received token signal TK_IN, the token management block 171A may receive another token signal (that is, any one of the multi-token signals MTK). In this case, the token management block 171A may bypass the received token signal TK_IN to another memory device, except for the token signal TK_IN possessed by the token management block 171A.

At step S160 (i.e., Output TK_OT), when the peak zone operation (PZO) is completed, the control logic 160 may provide the peak zone operation end signal PZ_END to the token management block 171A. Furthermore, the token generation block 172A may generate a token signal TK_OT according to the token generation signal TK_G provided from the token management block 171A, and transmit the generated token signal TK_OT to another memory device.

In this way, the memory devices 100 to 400 may simultaneously perform the peak zone operation (PZO) according to the multi-token signals MTK.

Figure 8:
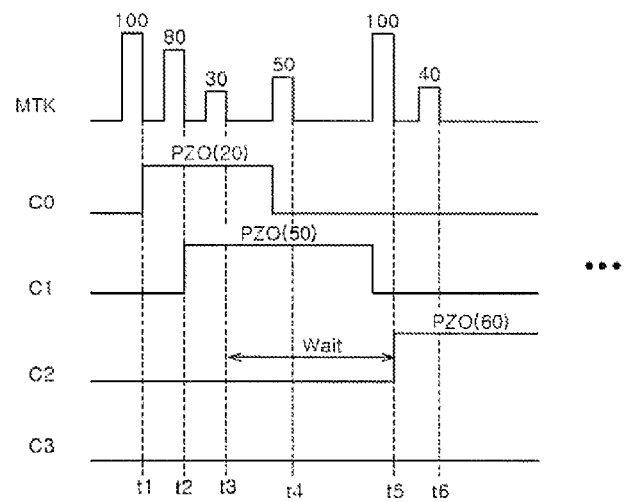
FIG. 8 is a timing diagram for explaining an operating method of the memory system according to an embodiment.

FIG. 8 is a timing diagram for explaining an operating method of the memory system according to an embodiment. According to the various embodiments associated with FIG. 8, the memory system 1000 or 2000 of FIG. 2 or 3 may be configured to use the magnitude of an available consumption current within a limit current thereof as a token signal TK. In the memory system 1000 or 2000, the memory devices 100 to 400 (i.e., C0(100), C1(200), C2(300), and C3(400)) compare the magnitude of a consumption current required for a peak zone operation (PZO) to the magnitude of the available consumption current obtained based on the token signal TK, and decide whether or not to perform the peak zone operation (PZO) according to the comparison result. Therefore, the memory devices 100 to 400 may simultaneously perform or substantially simultaneously perform the peak zone operation (PZO) within the limit current of the memory system 1000 or 2000.

In FIG. 8, suppose that the magnitude of the limit current of the memory system 1000 or 2000 is 100, the magnitude of the consumption current required for the peak zone operation (PZO) of the memory device C0 is 20 (i.e., PZO (20)), the magnitude of the consumption current required for the peak zone operation (PZO) of the memory device C1 is 50 (i.e., PZO (50)), and the magnitude of the consumption current required for the peak zone operation (PZO) of the memory device C2 is 60 (i.e., PZO (60)), for convenience of description. Furthermore, suppose that the memory devices C0, C1, and C2 should perform a peak zone operation (PZO), but are waiting for a peak zone operation (PZO) because the token signal TK has not been received. Furthermore, suppose that the memory device C3 has no request for the peak zone operation (PZO).

According to the connection relation among the memory devices C0 to C3, that is, according to the token terminal connection relation of FIGS. 2 and 3, the first token signal TK is transmitted to the memory device C0 at a time point t1. As defined above, the token signal TK in the various embodiments associated with FIG. 8 indicates the magnitude of an available current. The memory device C0 compares the magnitude of the consumption current required for the peak zone operation (PZO) to the magnitude of an available current obtained based on the transmitted token signal TK. As supposed above, the magnitude (20) of the consumption current required for the peak zone operation (PZO) of the memory device C0 is smaller than the magnitude (100) of the available current obtained based on the token signal TK (i.e., see MTK signal of FIG. 8). Therefore, the memory device C0 performs the peak zone operation (PZO).

After the peak zone operation (PZO) is started, the memory device C0 generates a token signal TK based on the magnitude (80) of the rest current obtained by subtracting the magnitude (20) of the consumption current required for the peak zone operation (PZO) from the magnitude (100) of the available current, and transmits the generated token signal TK to the memory device C1 at a time point t2.

The memory device C1 compares the magnitude of the consumption current required for the peak zone operation (PZO) to the magnitude of an available current obtained based on the transmitted token signal TK. As referenced above, the magnitude (50) of the consumption current required for the peak zone operation (PZO) of the memory device C1 is smaller than the magnitude (80) of the available current obtained based on the token signal TK. Therefore, the memory device C1 performs the peak zone operation (PZO). Furthermore, after the peak zone operation (PZO) is started, the memory device C1 generates a token signal TK based on the magnitude (30) of the rest current obtained by subtracting the magnitude (50) of the consumption current required for the peak zone operation (PZO) from the magnitude (80) of the available current, and transmits the generated token signal TK to the memory device C2 at a time point t3.

When the peak zone operation (PZO) of the memory device C0 is completed, the memory device C0 generates a token signal corresponding to the possessed token signal, that is, the magnitude (20) of the consumption current required for the peak zone operation (PZO), and transmits the generated token signal TK to the memory device C1 at a time point t4. Since the memory device C1 is performing the peak zone operation (PZO), the memory device C1 transmits the received token signal TK to the memory device C2.

The memory device C2 compares the magnitude of the consumption current required for the peak zone operation (PZO) to the magnitude of an available current obtained on the transmitted token signal TK. Since the magnitude (60) of the consumption current required for the peak zone operation (PZO) of the memory device C2 is larger than the magnitude (30) of the token signal TK transmitted at the time point t3 and the magnitude (50) of the token signal TK transmitted at the time point t4, the memory device C2 waits for a peak zone operation (PZO).

When the peak zone operation (PZO) of the memory device C1 is completed, the memory device C1 generates a token signal TK corresponding to the possessed token signal TK, that is, the magnitude (50) of the consumption current required for the peak zone operation (PZO), and transmits the generated token signal TK to the memory device C2 at a time point t5.

The memory device C2 compares the magnitude of the consumption current required for the peak zone operation (PZO) to the magnitude of an available current obtained based on the transmitted token signal TK again. Since the magnitude (60) of the consumption current required for the peak zone operation (PZO) of the memory device C2 is smaller than the magnitude (100) of the available current obtained based on the token signal TK, the memory device C2 performs the peak zone operation (PZO). Furthermore, after the peak zone operation (PZO) is started, the memory device C2 generates a token signal TK based on the magnitude (40) of the rest current obtained by subtracting the magnitude (60) of the consumption current required for the peak zone operation (PZO) from the magnitude (100) of the available current, and transmits the generated token signal TK to the memory device C3 at a time point t6.

In this way, the memory devices C0 to C3 of the memory system 1000 or 2000 may simultaneously perform the peak zone operations (PZOs). Therefore, the power consumption of the memory system 1000 or 2000 may be stabilized. Furthermore, since the peak zone operations (PZOs) may be simultaneously performed within the limit current, the operation speed of the memory system 1000 or 2000 may be improved.

Figure 9:
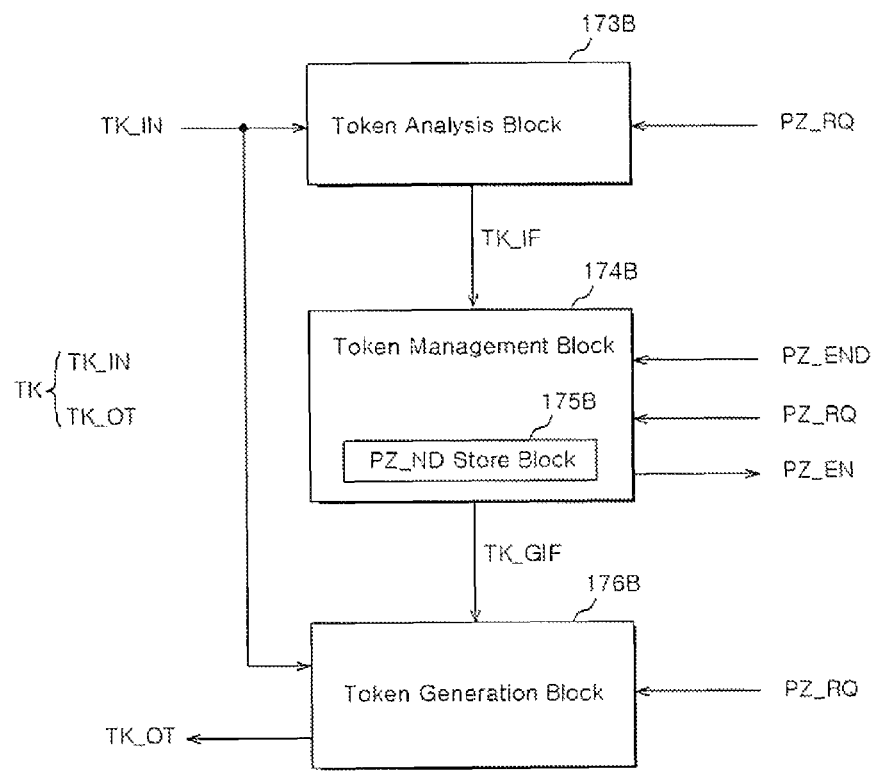
FIG. 9 is a block diagram illustrating a token unit of the memory device according to the embodiments associated with FIG. 8.

FIG. 9 is a block diagram illustrating the token unit of the memory device according to the various embodiments associated with FIG. 8. FIG. 9 illustrates the token unit 170B configured to process a token signal TK indicating the magnitude of an available consumption current. The token unit 170B may include a token analysis block 173B, a token management block 174B, and a token generation block 176B.

The token analysis block 173B may be configured to receive a token signal TK_IN from another memory device. The token analysis block 173B may be configured to operate according to the peak zone operation request signal PZ_RQ provided from, for example, the control logic 160 of FIG. 4. When the peak zone operation request signal PZ_RQ is activated, the token analysis block 173B may calculate the magnitude of an available current based on the received token signal TK_IN. The token analysis block 173B may be configured to generate token information TK_IF based on the magnitude of the available current, and provide the token information TK_IF to the token management block 174B.

The token generation block 176B may be configured to operate according to the peak zone operation request signal PZ_RQ provided from the control logic 160. Furthermore, the token generation block 176B may be configured to operate according to token generation information TK_GIF provided from the token management block 174B. The token generation block 176B may be configured to bypass the received token signal TK_IN, when the control logic 160 has no request for a peak zone operation (PZO), that is, when the peak zone operation request signal PZ_RQ is not activated. The token generation block 176B may be configured to generate the token signal TK_OT based on the token generation information TK_GIF and transmit the generated token signal TK_OT to another memory device, when the control logic 160 has a request for a peak zone operation (PZO), that is, when the peak zone operation request signal PZ_RQ is activated.

The token management block 174B may be configured to operate according to the peak zone operation request signal PZ_RQ and the peak zone operation end signal PZ_END provided from the control logic 160. The token management block 174B may be configured to control the token generation block 176B to bypass the received token signal TK_IN or provide the peak zone operation enable signal PZ_EN to the control logic 160, in response to the signal PZ_RQ or PZ_END.

For example, when the control logic 160 has no request for a peak zone operation (PZO), that is, when the peak zone operation request signal PZ_RQ is not activated, the token management block 174B controls the token generation block 176B to bypass the received token signal TK_IN. In this case, the token management block 174B does not provide the token generation information TK_GIF to the token generation block 176B. Therefore, as described above, the token generation block 176B bypasses the received token signal TK_IN in response to the deactivated peak zone operation request signal PZ_RQ.

As another example, when the control logic 160 makes a request for a peak zone operation (PZO), that is, when the peak zone operation request signal PZ_RQ is activated, the token management block 174B compares the token information TK_IF indicating the magnitude of an available current to the peak zone operation information PZ_ND on the consumption current required for the peak zone operation (PZO). For this operation, the token management block 174B may include a peak zone operation information store block 175B configured to store the peak zone operation information PZ_ND.

When the token information TK_IF is larger than the peak zone operation information PZ_ND, the token management block 174B provides the activated peak zone operation enable signal PZ_EN to, for example, the control logic 160. When the peak zone operation enable signal PZ_EN is activated, the control logic 160 may perform the peak zone operation (PZO). After the peak zone operation (PZO) is started, the token management block 174B may control the token generation block 176B to generate a token signal TK_OT based on the magnitude of the rest current obtained by subtracting the magnitude of the consumption current required for the peak zone operation (PZO) from the magnitude of the available current. In this case, the token management block 174B may provide the information on the magnitude of the rest current as the token generation information TK_GIF to the token generation block 176B. On the other hand, when the token information TK_IF is smaller than the peak zone operation information PZ_ND, the token management block 174B does not activate the peak zone operation enable signal PZ_EN. The control logic 160 waits for a peak zone operation (PZO), when the peak zone operation enable signal PZ_EN is not activated.

As another example, when the peak zone operation (PZO) is completed, that is, when the peak zone operation end signal PZ_END is activated, the token management block 174B controls the token generation block 176B to transmit the token signal TK_OT. In this case, the token management block 174B may provide the token generation information TK_GIF to the token generation block 176B. Here, the token generation information TK_GIF is information on the magnitude of the consumption current required for the peak zone operation (PZO). The token generation block 176B may generate a token signal TK_OT based on the token generation information TK_GIF, and transmit the generated token signal TK_OT to another memory device.

Figure 10:
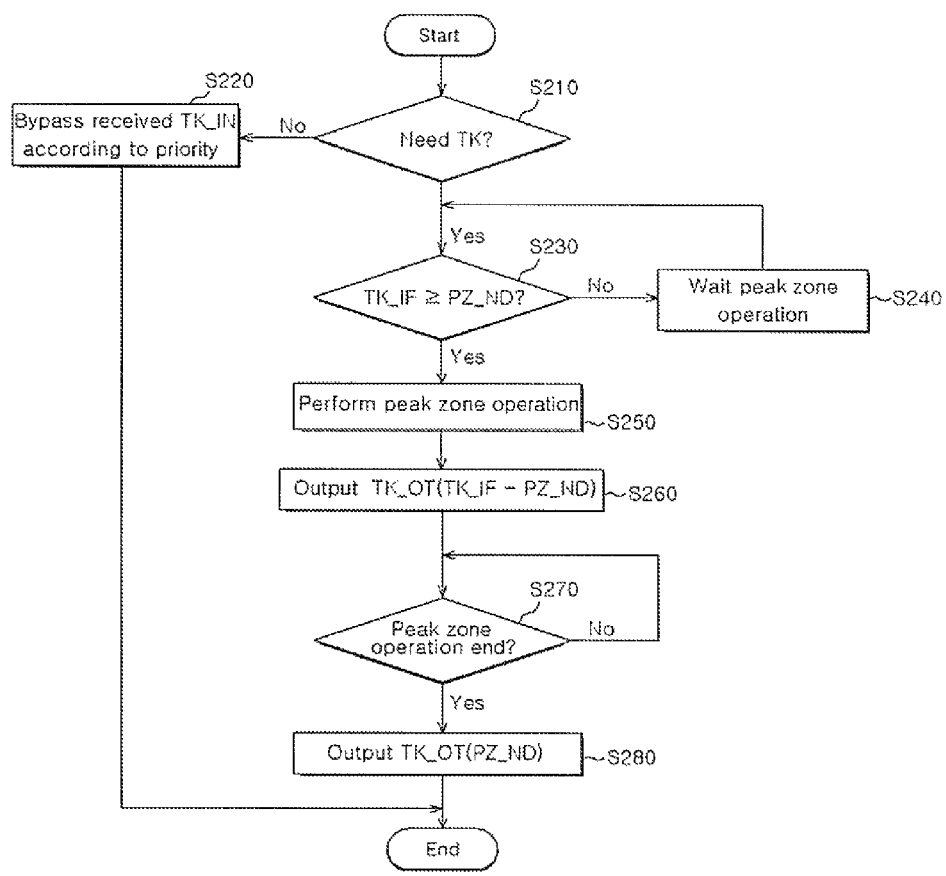
FIG. 10 is a flow chart for explaining the operation of a memory device following the operating method of the memory system according to the embodiments associated with FIG. 8.

FIG. 10 is a flow chart for explaining the operation of a memory device following the operating method of the memory system according to the embodiments associated with FIGS. 8 and 9. Each of the memory devices 100 to 400 (i.e., see also FIGS. 2 and 3, elements C0(100), C1 (200), C2(300) and C3(400)) should operate according to certain rules, in order to transmit a token signal TK_OT excluding the magnitude of a current required for a peak zone operation (PZO) and transmit a token signal TK_OT corresponding to the magnitude of a current consumed during the peak zone operation (PZO) inside the memory system 1000 or 2000 of FIGS. 2 to 3. Referring to FIGS. 9 and 10, the operation of the memory device will be described below.

At step S210 (i.e., Need TK?), the token management block 174B and the token generation block 176B determines whether a token signal TK is needed or not. That is, the token management block 174B and the token generation block 176B determine whether the peak zone operation request signal PZ_RQ provided from, for example, the control logic 160 of FIG. 4 is activated or not.

At step S220 (i.e., Bypass received TK_IN according to priority), the token generation block 176B may bypass a received token signal TK_IN according to a priority, when the token signal TK is not needed (i.e., No). Here, the priority indicates an order at which the token signal TK_IN is received.

At step S230 (i.e., TK_IF≥PZ_ND?), the token management block 174B compares token information TK_IF calculated based on the received token signal TK_IN to the peak zone operation information PZ_ND, when the token signal TK is needed (i.e., Yes). When the token information TK_IF is smaller than the peak zone operation information PZ_ND (i.e., No), the procedure proceeds to step S240. When the token information TK_IF is larger than the peak zone operation information PZ_ND (i.e., Yes), the procedure proceeds to step S250.

At step S240 (i.e., Wait peak zone operation), the control logic 160 waits for a peak zone operation (PZO) according to the deactivated peak zone operation enable signal PZ_EN provided from the token management block 174B.

At step S250 (i.e., perform peak zone operation), the control logic 160 performs the peak zone operation (PZO) according to the activated peak zone operation enable signal PZ_EN provided from the token management block 174B.

At step S260 (i.e., Output TK_OT(TK_IF−PZ_ND)), the token generation block 176B transmits the token signal TK_OT to another memory device according to the control of the token management block 174B after the peak zone operation (PZO) is started. The token signal TK_OT transmitted at step S260 has information corresponding to the magnitude of the rest current obtained by subtracting the magnitude of a consumption current required for the peak zone operation (PZO) (that is, the peak zone operation information PZ_ND) from the magnitude of an available current (that is, the token information TK_IF). When the token signal TK_OT is transmitted to another memory device, the token signal TK_OT may indicate the magnitude of a current which can be used by the corresponding memory device.

At step S270 (i.e., Peak zone operation end?), the token management block 174B determines whether the peak zone operation (PZO) was ended or not. That is, the token management block 174B checks whether the peak zone operation end signal PZ_END provided from, for example, the control logic 160 is activated or not. When the peak zone operation end signal PZ_END is not activated (i.e., No), step S270 is repeated. When the peak zone end signal PZ_END is activated (i.e., Yes), the procedure proceeds to step S280.

At step S280 (Output TK(PZ_ND), the token generation block 176B transmits the token signal TK_OT to another memory device according to the control of the token management block 174B. The token signal TK_OT transmitted at step S280 has information on the magnitude of a current consumed during the peak zone operation (PZO), that is, the magnitude of the consumption current required for the peak zone operation (PZO).

Additionally, step S260 may be omitted if necessary. For example, when the token signal TK_OT is transmitted to another memory device after the peak zone operation (PZO) is completed, a token signal TK_OT having the same information (that is, the magnitude of an available current) as the received token signal TK_IN may be generated and transmitted to another memory device.

In this way, the memory devices 100 to 400 may transmit the token signal TK having information on the magnitude of the limit current, that is, the available current and the magnitude of the current consumed during the peak zone operation (PZO). Furthermore, the memory devices 100 to 400 may simultaneously perform the peak zone operation (PZO) according to the token signal TK.

Figure 11:
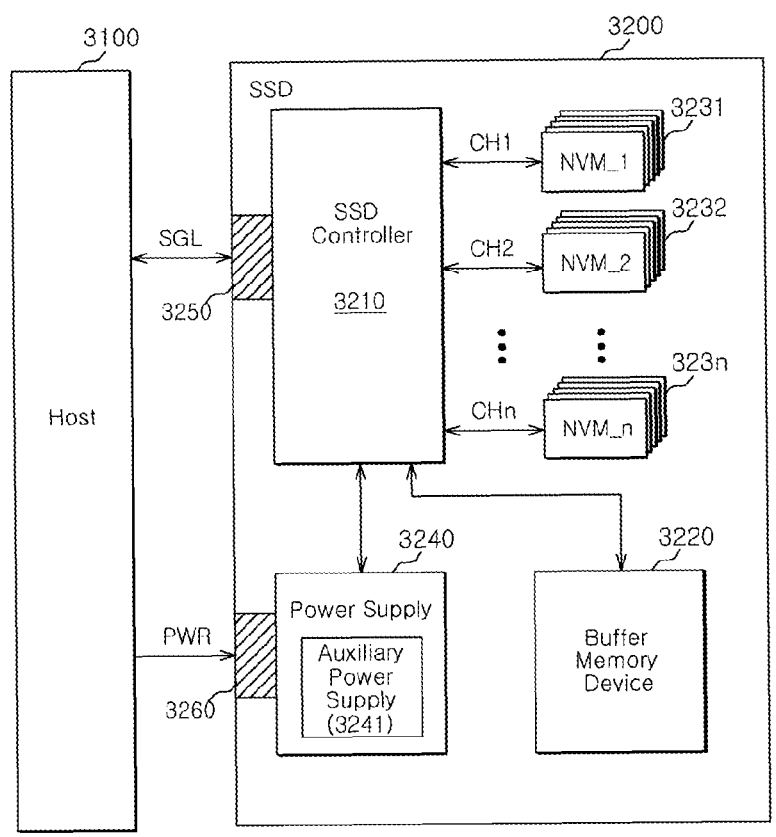
FIG. 11 is a block diagram illustrating an example in which the memory system according to an embodiment is applied.

FIG. 11 is a block diagram illustrating an example in which the memory system according to the various embodiments as applied. Referring to FIG. 11, a data processing system 3000 may include a host 3100 and a solid state drive (SSD) 3200.

The SSD 3200 may include an SSD controller 3210, a buffer memory device 3220, a plurality of memory devices 3231 to 323n, a power supply 3240, a signal connector 3250, and a power connector 3260. The SSD 3200 has the same configuration as the memory system 1000 or 2000 of FIG. 2 or 3 according to the embodiments. That is, the SSD controller 3210 and the memory devices 3221 to 323n may have a connection structure for transmitting and receiving a token signal TK, and may transmit a token signal TK based on such a structure. The SSD controller 3210 and the memory devices 3231 to 323n may operate according to the operating method according to the various embodiments associated with the figures as discussed above.

The SSD 3200 operates in response to a request of the host 3100. That is, the SSD controller 3210 may be configured to access the memory devices 3231 to 323n in response to a request from the host 3100. For example, the SDD controller 3210 may be configured to control read, program, and erase operations of the memory devices 3231 to 323n.

The buffer memory device 3220 may be configured to temporarily store data which are to be stored in the memory devices 3231 to 323n. Furthermore, the buffer memory device 3220 may be configured to temporarily store data read from the memory devices 3231 to 323n. The data which are temporarily stored in the buffer memory device 3220 are transmitted to the host 3100 or the memory devices 3231 to 323n according to the control of the SSD controller 3210.

The memory devices 3231 to 323n are used as storage media of the SSD 3200. The memory devices 3231 to 323n are connected to the SSD controller 3210 through a plurality of channels CH1 to CHn. One channel may be connected to one or more memory devices. The memory devices connected to one channel may be connected to the same signal bus and data bus.

The power supply 3240 may be configured to provide power PWR inputted through the power connector 3260 into the SSD 3200. The power supply 3240 may include an auxiliary power supply 3241. The auxiliary power supply 3241 may be configured to supply power to normally terminate the SSD 3200, when sudden power off occurs. The auxiliary power supply 3241 may include super capacitors capable of storing the power PWR.

The SSD controller 3210 may be configured to exchange signals SGL with the host 3100 through the signal connector 3250. Here, the signals SGL may include commands, addresses, data and the like. The signal connector 3250 may include a connector such as PATA (Parallel Advanced Technology Attachment), SATA (Serial Advanced Technology Attachment), SCSI (Small Computer System Interface), or SAS (Serial SCSI), according to the interface method between the host 3100 and the SSD 3200.

Figure 12:
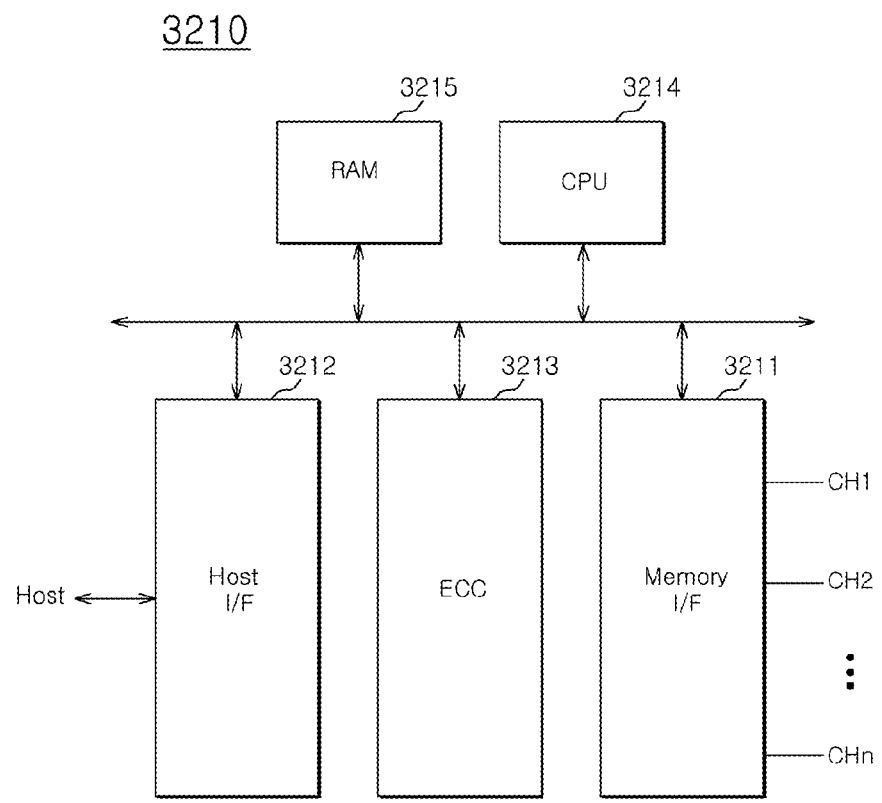
FIG. 12 is a block diagram illustrating an SSD controller of FIG. 11.

FIG. 12 is a block diagram illustrating the SSD controller of FIG. 11. Referring to FIG. 10, the SSD controller 3210 may include a memory interface 3211, a host interface 3212, an ECC unit 3213, a CPU 3214, and a RAM 3215.

The memory interface 3211 may be configured to provide a command and an address to the memory devices 3231 to 323n. Furthermore, the memory interface 3211 may be configured to exchange data with the memory devices 3231 to 323n. The memory interface 3211 may scatter data transferred from the buffer memory device 3220 over the respective channels CH1 to CHn, according to the control of the CPU 3214. Furthermore, the memory interface 3211 transmits data read from the memory devices 3231 to 323n to the buffer memory device 3220, according to the control of the CPU 3214.

The host interface 3212 may be configured to provide an interface with the SSD 3200 in response to the protocol of the host 3100. For example, the host interface 3212 may be configured to communicate with the host 3100 through any one of PATA (Parallel Advanced Technology Attachment), SATA (Serial Advanced Technology Attachment), SCSI (Small Computer System Interface), SAS (Serial SCSI) protocols. Furthermore, the host interface 3212 may perform a disk emulation function of supporting the host 3100 to recognize the SSD 3200 as a hard disk drive (HDD).

The ECC unit 3213 may be configured to generate parity bits based on the data transmitted to the memory devices 3231 to 323n. The generated parity bits may be stored in spare areas of the memory devices 3231 to 323n. The ECC unit 3213 may be configured to detect an error of data read from the memory devices 3231 to 323n. When the detected error falls within a correction range, the ECC unit 3213 may correct the detected error.

The CPU 3214 may be configured to analyze and process a signal SGL inputted from the host 3100. The CPU 3214 controls overall operations of the SSD controller 3210 in response to a request of the host 3100. The CPU 3214 controls the operations of the buffer memory device 3220 and the memory devices 3231 to 323n according to firmware for driving the SSD 3200. The RAM 3215 is used as a working memory device for driving the firmware.

Figure 13:
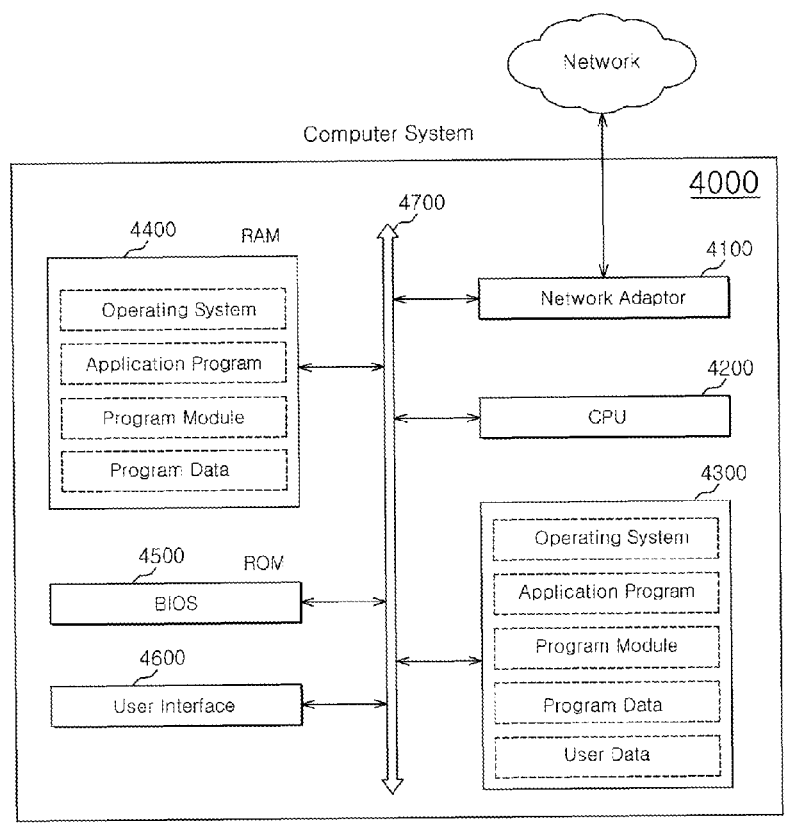
FIG. 13 is a block diagram illustrating a computer system in which an SSD of FIG. 11 is mounted.

FIG. 13 is a block diagram illustrating a computer system in which the SSD of FIG. 11 is mounted. Referring to FIG. 11, the computer system 4000 may include a network adapter 4100, a CPU 4200, a data storage device 4300, a RAM 4400, a ROM 4500, and a user interface 4600, which are electrically connected to the system bus 4700. Here, the data storage device 4300 may include the SSD 3200 illustrated in FIG. 11.

The network adapter 4100 may be configured to provide an interface between the computer system 4000 and external networks. The CPU 4200 may be configured to perform overall arithmetic operations for driving an operating system or application programs staying in the RAM 4400.

The data storage device 4300 may be configured to store overall data required by the computer system 4000. For example, the operating system for driving the computer system 4000, application programs, various program modules, program data, and user data may be stored in the data storage device 4300.

The RAM 4400 may be used as a working memory device of the computer system 4000. During booting, the operating system, application programs, various program modules, which are read from the data storage device 4300, and program data required for driving the programs are loaded into the RAM 4400. The ROM 4500 stores a basic input/output system (BIOS) which is enabled before the operating system is driven. Through the user interface 4600, information exchange is performed between the computer system 4000 and a user.

Although not illustrated in the drawing, the computer system 4000 may further include a battery, application chipsets, a camera image processor (CIP) and the like.

According to the various embodiments, the power consumption of the memory system may be stabilized.

While various embodiments have been described above, it will be understood to those skilled in the art that the embodiments described are by way of example only. Accordingly, the memory system described herein should not be limited based on the described embodiments.

What is claimed is:

1. A memory system comprising first to third memory devices each having an input terminal for receiving a token signal and an output terminal for transmitting the token signal,
wherein the input terminal of each of the first to third memory devices are connected to the output terminal of another memory device through a ring topology,
a subset of the first to third memory devices substantially simultaneously perform an operation of consuming a peak current in response to any one of a plurality of token signals, and
each of the first to third memory devices possesses only any one of the plurality of token signals and transmits the other token signals to another memory device.

2. The memory system according to claim 1, wherein the memory system further comprises:
a memory controller configured within the ring topology; and
wherein the memory controller is configured for transmitting the token signal to the first memory device and for receiving the outputted token signal of the third memory device.

3. The memory system according to claim 1, wherein the memory system further comprises:
a memory controller configured for transmitting only a first token signal to the first memory device; and
wherein the first memory device is configured for receiving the outputted token signal of the third memory device.

4. The memory system according to claim 1, wherein each of the first to third memory devices transmits the plurality of token signals, inputted while the memory device performs the operation of consuming the peak current, to another memory device according to the input order.

5. The memory system according to claim 1, wherein each of the first to third memory devices transmits the possessed token signal to another memory device, when the operation of consuming the peak current is completed.

6. The memory system according to claim 1, wherein the number of the plurality of token signals is decided based on the peak currents of the first to third memory devices.

7. The memory system according to claim 1, wherein each of the first to third memory devices comprises a token unit configured to process the plurality of token signals.

8. The memory system according to claim 7, wherein the token unit comprises:
a token management block configured to control the peak current consumption operation to be performed or to not be performed according to whether the plurality of token signals are received or not; and
a token generation block configured to transmit the received token signals according to the control of the token management block.

9. The memory system according to claim 1, wherein each of the first to third memory devices are configured for receiving a chip enable signal.

10. The memory system according to claim 1, wherein the memory system further comprises a memory controller configured for providing a chip enable signal to the memory devices.

11. An operating method of a memory device, comprising the steps of:
receiving a token signal from another memory device;
calculating the magnitude of an available current based on the received token signal;
comparing the magnitude of the available current to the magnitude of a peak current of the memory device; and
performing an operation of consuming the peak current when the magnitude of the available current is larger than or equal to the magnitude of the peak current.

12. The operating method according to claim 11, further comprising the step of transmitting the received token signal to another memory device.

13. The operating method according to claim 12, wherein the step of transmitting the received token signal is performed before the step of performing the operation of consuming the peak current.

14. The operating method according to claim 13, wherein the step of transmitting the received token signal comprises the step of generating a token signal to be transmitted, based on the magnitude of a current obtained by subtracting the magnitude of the peak current from the magnitude of the available current, and
the generated token signal is transmitted to the another memory device.

15. The operating method according to claim 13, wherein a token signal received while the operation of consuming the peak current is performed is transmitted to the another memory device, without performing the step of calculating the magnitude of the available current and the step of comparing the magnitude of the available current to the magnitude of the peak current.

16. The operating method according to claim 12, wherein the step of transmitting the received token signal is performed after the step of performing the operation of consuming the peak current.

17. The operating method according to claim 16, wherein the step of transmitting the received token signal comprises the step of generating a token signal to be transmitted, based on the magnitude of the available current, and
the generated token signal is transmitted to the another memory device.

18. The operating method according to claim 11, wherein when the magnitude of the available current is smaller than the magnitude of the peak current, the memory device waits for the operation of consuming the peak current.

19. The operating method according to claim 11, further comprising the step of receiving a first token signal from a memory controller,
   wherein the first token signal comprises information corresponding to the magnitude of a maximum allowable current of a memory system.

20. A memory system comprising first and second memory devices each having an input terminal for receiving a token signal and an output terminal for transmitting the token signal,
   wherein the output terminal of the first memory device is connected to the input terminal of the second memory device,
   the output terminal of the second memory device is connected to the input terminal of the input terminal of the first memory device, and
   the first and second memory devices perform an operation of consuming a peak current based on the magnitude information of an available current, contained in a received token signal.

21. The memory system according to claim 20, wherein each of the first and second memory devices calculates the magnitude of the available current from the received token signal, compares the calculated magnitude of the available current to the magnitude of the peak current, and performs the operation of consuming the peak current according to the comparison result.

22. The memory system according to claim 21, wherein each of the first and second memory devices performs the operation of consuming the peak current when the magnitude of the available current is larger than or equal to the magnitude of the peak current.

23. The memory system according to claim 21, wherein each of the first and second memory devices waits for the operation of consuming the peak current when the magnitude of the available current is smaller than the magnitude of the maximum peak current.

24. The memory system according to claim 21, wherein each of the first and second memory devices comprises a token unit configured to process the token signal.

25. The memory system according to claim 24, wherein the token unit comprises:
   a token analysis block configured to calculate the magnitude of the available current from the received token signal;
   a token management block configured to compare the magnitude of the available current to the magnitude of the peak current and control the peak current consuming operation to be performed or to not be performed according to the comparison result; and
   a token generation block configured to transmit the received token signal according to the control of the token management block.

26. The memory system according to claim 25, wherein the token management block comprises an operation information store block configured to store the magnitude of the peak current.

27. The memory system according to claim 20, wherein each of the first and second memory devices transmits the received token signal to another memory device.

28. The memory system according to claim 20, wherein each of the first and second memory devices are configured for receiving a chip enable signal.

* * * * *